United States Patent
Na et al.

(10) Patent No.: US 8,523,163 B2
(45) Date of Patent: *Sep. 3, 2013

(54) INSERT FOR CARRIER BOARD OF TEST HANDLER

(75) Inventors: Yun-Sung Na, Cheonan-Si (KR); Dong-Han Kim, Suwon-Si (KR); Young-Yong Kim, Seongnam-Si (KR)

(73) Assignee: TechWing., Co. Ltd., Hwaseong-si (KR)

( * ) Notice: Subject to any disclaimer, the term of this patent is extended or adjusted under 35 U.S.C. 154(b) by 724 days.

This patent is subject to a terminal disclaimer.

(21) Appl. No.: 12/361,945

(22) Filed: Jan. 29, 2009

(65) Prior Publication Data

US 2009/0196719 A1    Aug. 6, 2009

(30) Foreign Application Priority Data

Jan. 31, 2008    (KR) .................. 10-2008-0009924

(51) Int. Cl.
| | |
|---|---|
| *B23Q 3/00* | (2006.01) |
| *G03B 23/02* | (2006.01) |
| *G11B 23/107* | (2006.01) |
| *H01R 12/00* | (2006.01) |
| *H05K 1/00* | (2006.01) |
| *H01L 21/683* | (2006.01) |

(52) U.S. Cl.
   USPC .............. 269/287; 206/724; 242/348; 439/73

(58) Field of Classification Search
   USPC ......... 269/287; 206/724, 714, 726; 242/348; 439/73, 590
   See application file for complete search history.

(56) References Cited

U.S. PATENT DOCUMENTS

| | | | | |
|---|---|---|---|---|
| 3,409,861 | A | * | 11/1968 | Barnes et al. ................. 439/331 |
| 3,746,157 | A | * | 7/1973 | I'Anson ....................... 206/724 |
| 3,755,048 | A | * | 8/1973 | Schubert ...................... 156/541 |
| 4,470,507 | A | * | 9/1984 | Burns .......................... 206/714 |
| 4,976,624 | A | * | 12/1990 | Ishizuka et al. ................ 439/70 |
| D313,586 | S | * | 1/1991 | Vitek ........................... D13/182 |
| 5,373,938 | A | * | 12/1994 | Kubo ........................... 206/701 |
| 5,742,487 | A | * | 4/1998 | Kobayashi et al. ........... 361/809 |
| 6,179,659 | B1 | * | 1/2001 | Moden .......................... 439/590 |
| 6,636,060 | B1 | | 10/2003 | Saito |
| 6,651,817 | B2 | * | 11/2003 | Shim et al. .................... 206/726 |
| 6,651,917 | B2 | * | 11/2003 | Momoi et al. ................ 242/348 |
| 6,974,924 | B2 | * | 12/2005 | Agnatovech et al. ......... 200/314 |
| 7,258,295 | B2 | * | 8/2007 | Satoh ........................... 242/348 |
| 7,371,078 | B2 | * | 5/2008 | Ito et al. ......................... 439/73 |
| 7,557,564 | B2 | * | 7/2009 | Shim et al. ............... 324/756.07 |
| 2007/0296419 | A1 | | 12/2007 | Aizawa et al. |
| 2008/0186015 | A1 | | 8/2008 | Osakabe |

FOREIGN PATENT DOCUMENTS

TW    381705 U    2/2000

* cited by examiner

*Primary Examiner* — Lee D Wilson
*Assistant Examiner* — Alvin Grant
(74) *Attorney, Agent, or Firm* — Jefferson IP Law, LLP

(57) ABSTRACT

An insert for a carrier board of a test handler is disclosed. The insert pocket having hooks is detachably coupled to the insert body. The insert body can be reused. The latch apparatus is installed to the insert pocket, so that the damaged latch apparatus can be easily replaced. The insert has a plurality of holes in the bottom of the loading part thereof, to expose the leads of the semiconductor devices through the holes in the lower direction. Thus, the insert can load semiconductor devices regardless of the sizes of the semiconductor devices.

14 Claims, 12 Drawing Sheets

INSERT FOR CARRIER BOARD OF TEST HANDLER

PRIORITY

This application claims the benefit under 35 U.S.C. §119(a) of a Korean patent application filed on Jan. 31, 2008 in the Korean Intellectual Property Office and assigned Serial No. 10-2008-0009924, the entire disclosure of which is hereby incorporated by reference.

BACKGROUND OF THE INVENTION

1. Field of the Invention

The present invention relates to a test handler and, more particularly, to an insert mounted onto a carrier board of a test handler.

2. Description of the Related Art

A test handler is an automated test system that transfers produced semiconductor devices to a tester, assists the tester to test the semiconductor devices, and then sorts the tested semiconductor devices according to the test results before the semiconductor devices are sold on the market.

The test handler is configured to include a plurality of carrier boards (including 'test trays') that are loaded with semiconductor devices and circulate through a preset path in the test handler.

The carrier board circulates through a preset path and becomes opposite the tester at a test site on the path. When the carrier board is located at the test site, the semiconductor devices loaded onto the carrier board are electrically connected to the test, so that they can be tested.

The carrier board mounts inserts thereon in a matrix form, where the inserts are loaded with semiconductor devices, respectively. The insert is configured to include a pair of latching apparatuses for holding or releasing a semiconductor device loaded thereonto.

Technology related to the carrier board, insert, and latch apparatus has been disclosed in: Korean Patent No. 10-0486412 entitled "INSERT OF TEST TRAY FOR TEST HANDLER," in which a carrier board is defined as a test tray, which is hereinafter called Conventional art 1.

In addition, in Korean Patent No. 10-0769105 entitled "INSERT AND ELECTRONIC COMPONENT HANDLER COMPRISING IT," which is hereinafter called Conventional art 2, technology is disclosed where the insert body is detachably coupled to the insert pocket (which is defined as a guide core in Conventional art 2).

According to prior art, the insert body is configured to include a hook mechanism and a latch mechanism, and the insert pocket loads semiconductor devices thereonto. Therefore, although semiconductor devices are replaced with different sized semiconductor devices, only the insert pocket is replaced but the insert body can be reused.

However, if the hook mechanism is damaged, the insert body should be replaced. Also, when semiconductor devices to be tested are replaced with different sized semiconductor devices, the insert pocket, which is one of the parts of the insert, should be replaced. Therefore, prior art still have a low reuse rate of resources.

In addition, since the parts included in the latch mechanism are small and complicated, their installation and disassembly are difficult. That is, the latch mechanism is difficult to be installed and replaced. These problems still remain in the prior art.

SUMMARY OF THE INVENTION

The present invention is to solve the above problems, and provides a technology where a hook, relatively easily damageable, is configured in an insert pocket of an insert, where the insert pocket can be detachably coupled to an insert body.

The present invention further provides a technology where an insert can be reused without replacing the insert or a part of the insert, although semiconductor devices to be tested are replaced with different sized semiconductor devices.

The present invention further provides a technology where a latch apparatus, relatively easily malfunctioned, is configured in an insert pocket of an insert, where the insert pocket can be detachably coupled to an insert body.

In accordance with an exemplary embodiment of the present invention, the present invention provides an insert for a carrier board of a test handler including: an insert body having a through-hole that allows a semiconductor device to be loaded to pass therethrough; and an insert pocket that is detachably coupled to the insert body and has a loading part onto which the semiconductor device passing through the through-hole is loaded. Here, the insert pocket includes at least one or more hooks at a side(s) of the loading part for detachably coupling to the insert body. The insert body comprises at least one or more hook receiving grooves on both sides of the through-hole, which can receive the at least one or more hooks, respectively, and at least one or more hook locking protrusions on which the at least one or more hooks can be hung, respectively. Preferably, the loading part comprises a position groove on the bottom thereof, to hold a position of the loaded semiconductor device.

Preferably, a plurality of holes are formed at the bottom, through which holes leads of the semiconductor device spaced apart from each other at a distance are exposed in the lower direction.

Preferably, the plurality of holes are formed spaced apart from each other at a certain distance, so that different sized semiconductor devices, whose leads are spaced apart from each other at the same as the distance between the plurality of holes, can be loaded.

Preferably, the insert body includes at least one or more latch apparatuses installed on the side walls of the through-hole to hold or release the semiconductor device loaded onto the loading part; wherein the at least one or more latch apparatuses hold or release the semiconductor device as the insert pocket is lifted up or lowered.

Preferably, the insert body comprises at least one or more latch apparatuses installed on the side walls of the through-hole to hold or release the semiconductor device loaded onto the loading part. The at least one or more latch apparatuses hold or release the semiconductor device by applying a pressure in the lower direction. The semiconductor device is loaded onto the loading part from the upper.

In accordance with another exemplary embodiment of the present invention, the present invention provides an insert for a carrier board of a test handler, including: a loading part on which a semiconductor device is loaded. Here, a position groove is formed at the bottom of the loading part to hold a position of the semiconductor device loaded onto the loading part.

Preferably, a plurality of holes are formed at the bottom, through which holes leads of the semiconductor device spaced apart from each other at a distance are exposed in the lower direction.

Preferably, the plurality of holes are formed spaced apart from each other at a certain distance, so that different sized semiconductor devices, whose leads are spaced apart from each other at the same as the distance between the plurality of holes, can be loaded.

In accordance with another exemplary embodiment of the present invention, the present invention provides an insert for a carrier board of a test handler including: an insert body having a through-hole through which a semiconductor device to be loaded passes; and an insert pocket having a loading part onto which the semiconductor device passing through the through-hole is loaded, the insert pocket being detachably coupled to the insert body. Here, the insert pocket includes: a loading frame having the loading part; and at least one or more latch apparatuses installed on the wall side(s) of the loading frame to hold or release the semiconductor device loaded onto the loading part.

Preferably, the at least one or more latch apparatus includes: a latch bar whose one end is pivotally coupled to the side of the loading frame and whose opposite end rotates with respect to the one end operating as a rotation axis, for holding or releasing the semiconductor device loaded onto the loading part; and a holding spring for applying an elastic force to the latch bar so that the latch bar can maintain its holding state.

Preferably, the insert pocket is coupled to the insert body to freely move within a certain space in the vertical direction with respect to the loading part. The opposite end of the latch bar protrudently extends from the rotation axis in the length direction of the latch bar. The insert body has a latch locking protrusion by which the extended portion of the opposite end of the latch bar is locked while the latch bar is rotated when the insert pocket is lifted up.

Preferably, the insert further includes a compression spring for applying a repulsive elastic force between the insert body and the insert pocket.

Preferably, the loading part has a position groove on the bottom thereof, to hold the loaded semiconductor device.

Preferably, a plurality of holes are formed at the bottom, through which holes leads of the semiconductor device spaced apart from each other at a distance are exposed in the lower direction.

Preferably, the plurality of holes are formed spaced apart from each other at a certain distance, so that different sized semiconductor devices, whose leads are spaced apart from each other at the same as the distance between the plurality of holes, can be loaded.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The features and advantages of the present invention will be more apparent from the following detailed description in conjunction with the accompanying drawings, in which.

Throughout the drawings, it should be noted that like reference numbers are used to depict the same or similar elements, features and structures.

BRIEF DESCRIPTION OF SYMBOLS IN THE DRAWINGS

Figure 1:
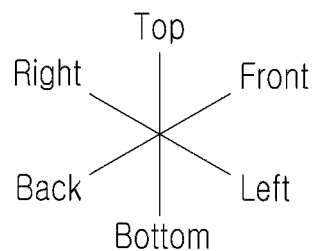
FIG. 1 is a partially cut-away perspective view illustrating an insert in accordance with a first embodiment of the present invention.
Figure 1:
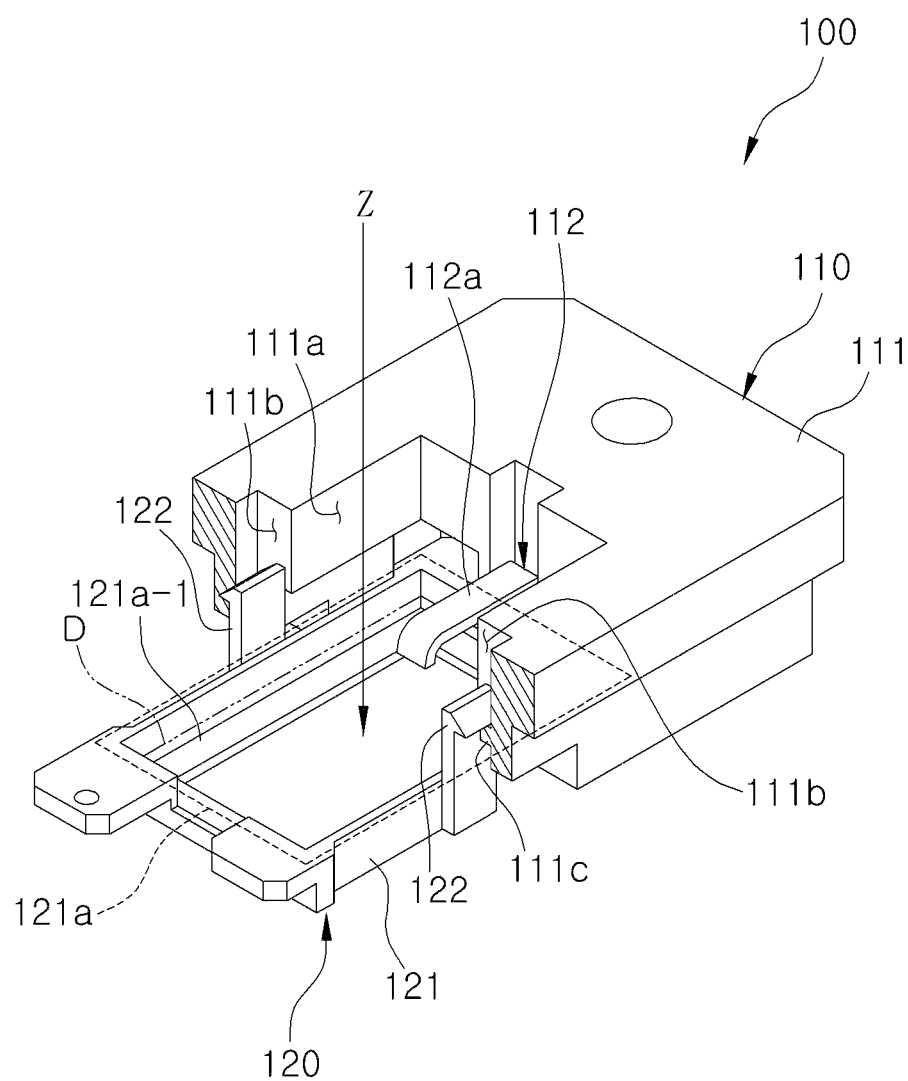

300: insert
310: insert body
320: insert pocket
322: hook
323: latch apparatus
330: compression spring
1021$a$-1: bottom surface
1021$a$-1$a$: hole
1021$a$-1$b$: position groove

DETAILED DESCRIPTION OF EXEMPLARY EMBODIMENTS

Exemplary embodiments of an insert for a carrier board of a test handler, according to the present invention, are described in detail with reference to the accompanying drawings. The insert for a carrier board of a test handler is hereinafter referred to as an "insert." The same reference numbers are used throughout the drawings to refer to the same or similar parts. Detailed descriptions of well-known functions and structures incorporated herein may be omitted to avoid obscuring the subject matter of the present invention.
<Embodiment 1>

FIG. 1 is a partially cut-away perspective view illustrating an insert 100 in accordance with a first embodiment of the present invention.

As shown in FIG. 1, the insert 100 includes an insert body 110 and an insert pocket 120.

The insert body 110 includes a housing 111 and a pair of latch apparatuses 112.

The housing 111 is configured to include: a through-hole 111$a$ for allowing a semiconductor device D to pass therethrough when the semiconductor device D is lowered, for loading, from the top side to the bottom side, i.e., in the Z-direction; hook receiving grooves 111$b$, formed at the right side and the left side of the through-hole 111$a$, for receiving hooks 122, which will be described later; and hook locking protrusions 111$c$ on which the hooks 122 can be hung.

The pair of latch apparatuses 112 (the rear latch apparatus is not shown in the drawings) are installed to both the front side and the rear side of the through-hole 111$a$ of the housing 111.

The latch apparatus 112 includes a latch bar 112$a$ whose one end is pivotally coupled to the housing 111 and whose opposite end rotates with respect to one end operating as a rotation axis. The latch bar 112$a$ holds or releases a semiconductor device loaded onto the insert pocket 120 as the opposite end is rotated.

The insert pocket 120 is detachably coupled to the insert body 110 in such a way as to freely move in the upper and lower directions. The insert pocket 120 has: a loading frame 121 shaped in an approximately rectangular form; and a pair of hooks 122 located at both the right side and left side of the loading frame 121.

The loading frame 121 includes a loading part 121$a$ having a separating prevention jaw 121$a$-1 that prevents a semiconductor device D, loaded onto the bottom of the loading frame 121, from separating downward.

The pair of hooks 122 is fixed to or integrally formed with the loading frame 121. The hooks 122 are received in the hook receiving grooves 111b and hung on the hook locking protrusions 111c.

In the following description, a use state of the insert 100 is explained in detail.

Figure 2:
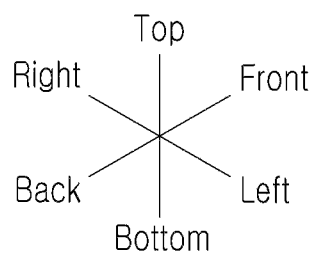
FIG. 2 is a view that describes the operation state of the insert of FIG. 1.
Figure 2:
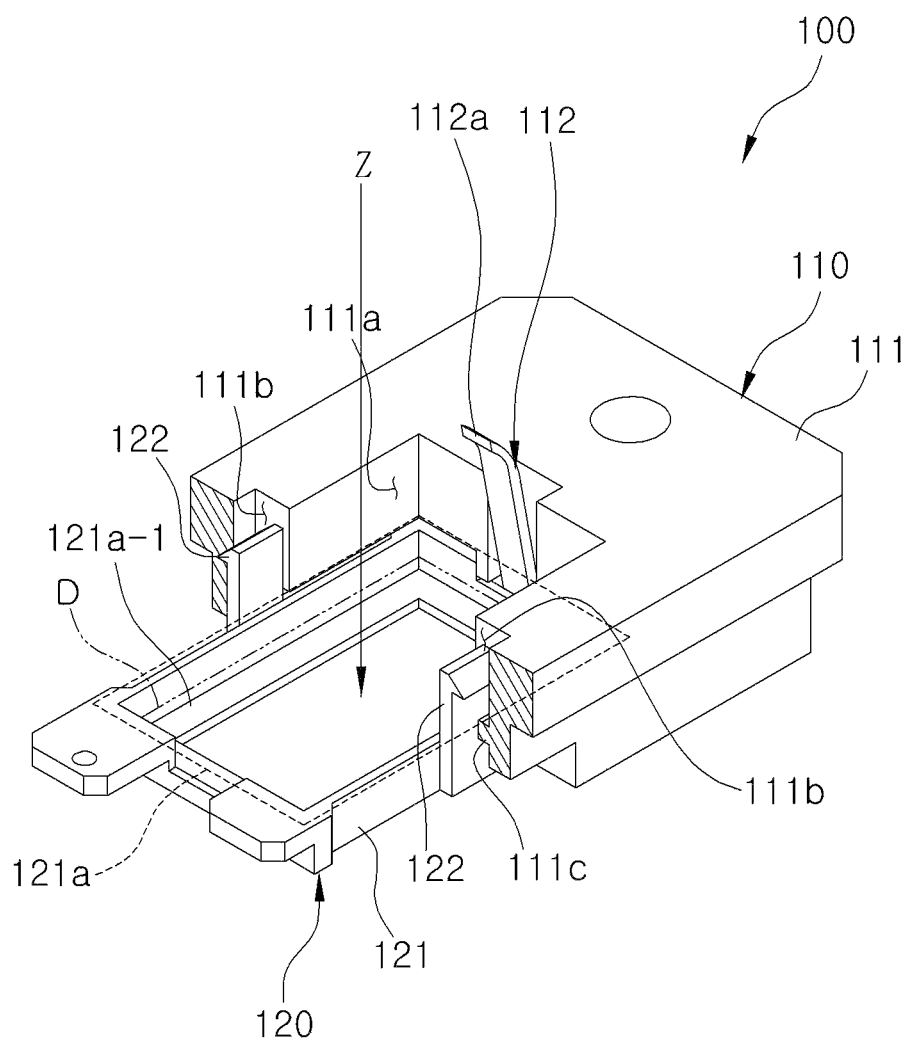

Referring to FIG. 2, when an external force is applied to the insert pocket 120 from the bottom side to the top side, the loading frame 121 is lifted up and pushes the latch bar 112a, so that one end of the latch bar 112a is pivotally lifted up and rotated with respect to the opposite end of the latch bar 112a. Thus, the loading part 121a is opened or the holding state of the semiconductor device D, loaded onto the loading part 121a, is released. That is, the semiconductor device D can be loaded onto or unloaded from the loading part 121a.

When the external force is removed, the insert pocket 120 is lowered to the bottom side by gravity and an elastic force of a spring (not shown) included in the latch apparatus 112. In addition, one end of the latch bar 112a is lowered and reversely rotated with respect to the opposite end of the latch bar 112a to close the loading part 121a or to hold a semiconductor device D loaded onto the loading part 121a, as shown in FIG. 1.

In an embodiment of an insert 100, when the hooks 122 are damaged, only the insert pocket 120 is replaced and the insert body 110 can be reused.

Although the an embodiment of an insert 100 is implemented in such a way as to include the latch apparatus 112 that is operated as the insert pocket 120 is lifted up or lowered, it should be understood that the present embodiment can be modified in such a way to employ an latch apparatus that is operated by pressure of a lower site decision apparatus, similar to the latch apparatus of Conventional art 1. In that case, the insert pocket does not need lifting up or lowering and accordingly is fixed to the insert body.

<Embodiment 2>

Figure 3:
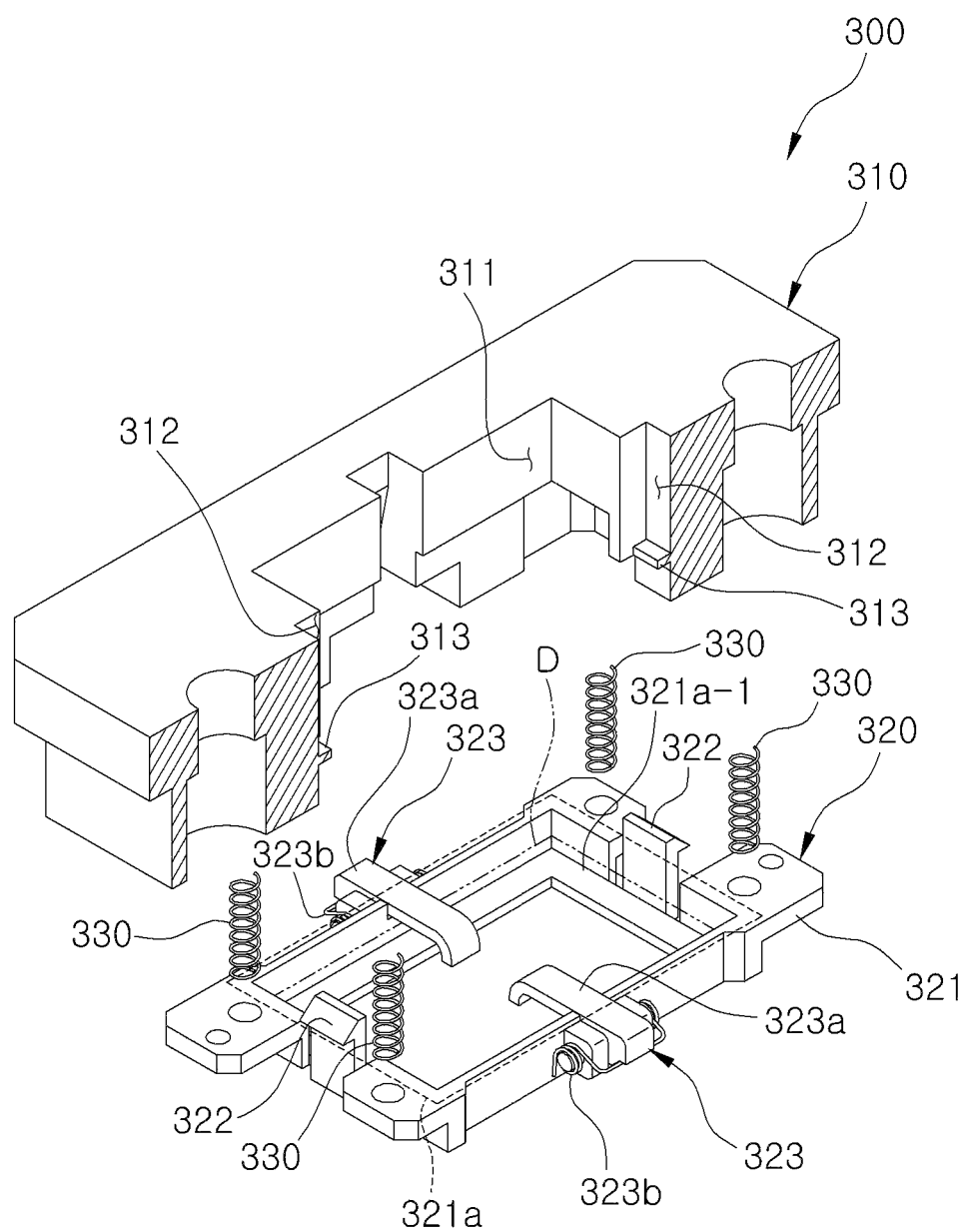
FIG. 3 is a partially cut-away, partially disassembled perspective view illustrating an insert in accordance with a second embodiment of the present invention.
Figure 4:
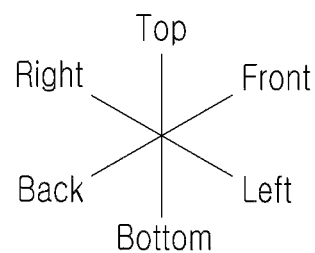
FIG. 4 and FIG. 5 show partially cut-away perspective views illustrating the insert of FIG. 3.
Figure 4:
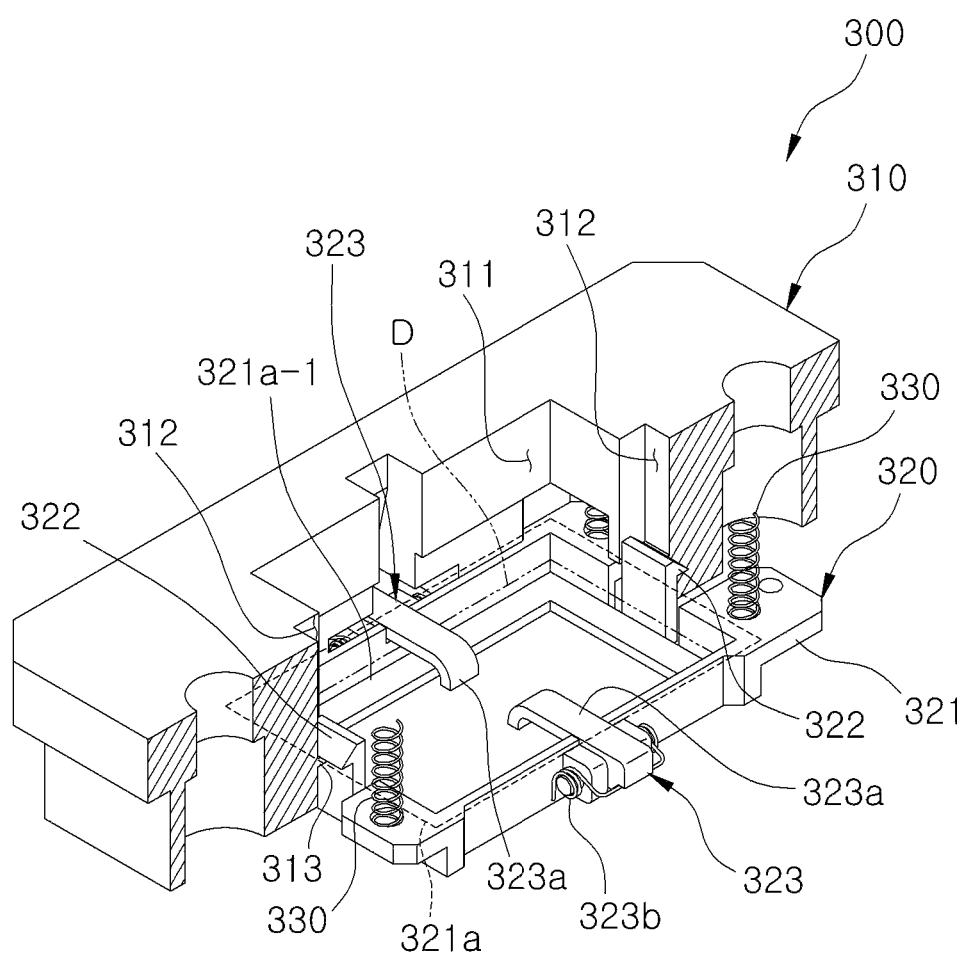
Figure 5:
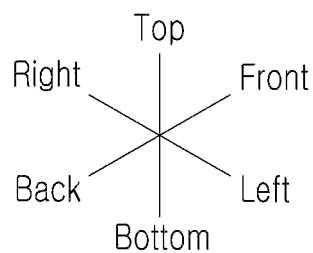
Figure 5:
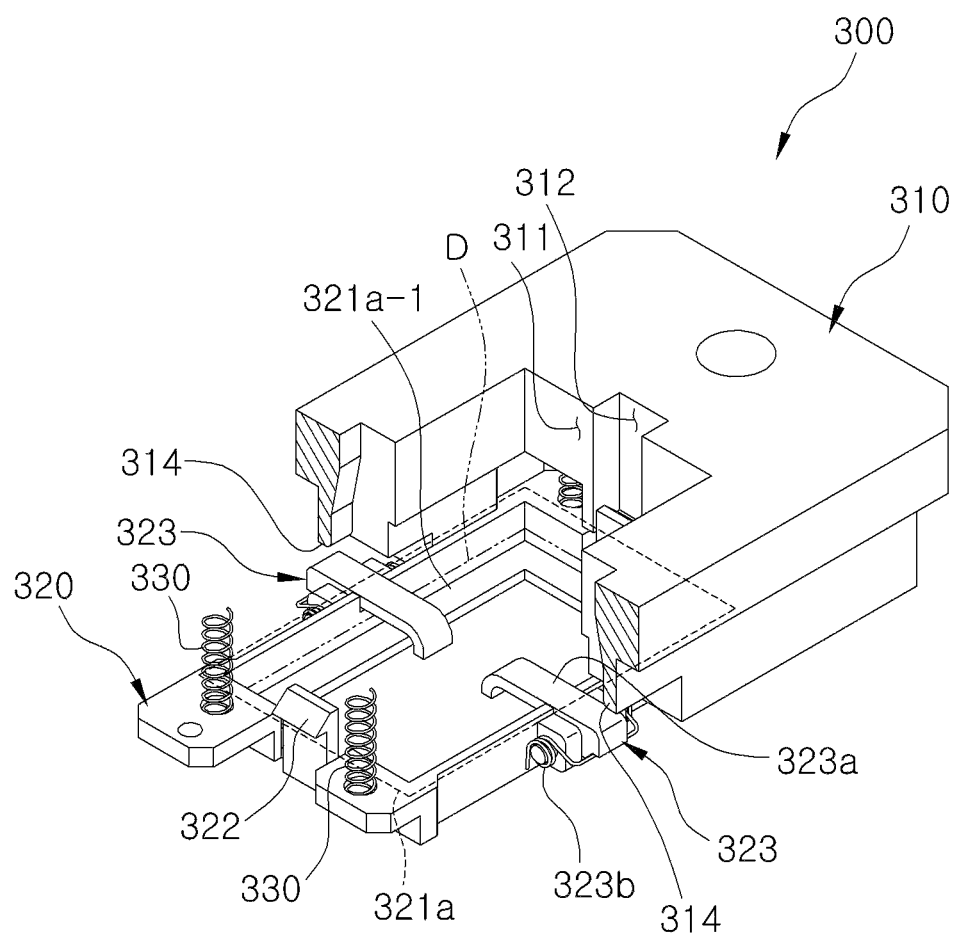

FIG. 3 is a partially cut-away, partially disassembled perspective view illustrating an insert 300 in accordance with a second embodiment of the present invention. FIG. 4 and FIG. 5 show partially cut-away perspective views illustrating the insert of FIG. 3.

As shown in FIG. 3, the insert 300 is configured to include an insert body 310, an insert pocket 320, and a compression spring 330.

The insert body 310 is configured to include: a through-hole 311 for allowing a semiconductor device D to pass therethrough when the semiconductor device D is lowered, for loading, from the top side to the bottom side; hook receiving grooves 312, formed at the front side and the rear side of the through-hole 311, for receiving hooks 322 which will be described later; and hook locking protrusions 313 on which the hooks 322 can be hung. As shown in FIG. 5, latch locking protrusions 314 are also formed at both the right side and the left side of the through-hole 311, which will be described in detail later.

The insert pocket 320 is detachably coupled to the insert body 310 in such a way as to freely move in the upper and lower directions. The insert pocket 320 has: a loading frame 321 shaped in an approximately rectangular form; a pair of hooks 322 located at both the front side and the rear side of the loading frame 321; and a pair of latch apparatuses 323 installed to both the right side and left side of the loading frame 321.

The loading frame 321 includes a loading part 321a having a separating prevention jaw 321a-1 that prevents a semiconductor device D, loaded onto the bottom of the loading frame 1321, from separating downward.

The pair of hooks 322 are fixed to or integrally formed with the loading frame 321. The hooks 321 are received in the hook receiving grooves 312 and hung on the hook locking protrusions 313.

The pair of latch apparatuses 323 is configured to include a latch bar 323a and a holding spring 323b.

Two latch bars 323a are pivotally coupled to both the right side and the left side of the loading frame 321, respectively. One end of each of the latch bars 323a is rotated with respect to the opposite end pivotally coupled to the loading frame 321 to hold or release the semiconductor device D loaded onto the loading part 321a. The opposite ends of the latch bars 323a extend a certain length in the lengthwise direction of the latch bar 323a, respectively, so that the extended portions of the opposite ends can be locked to the latch locking protrusions 314 when the insert pocket 320 is lifted up by an external force, as shown in FIG. 5.

The holding spring 323b is implemented by a torsion spring etc. that applies an elastic force to the latch bar 323a so that the latch bar 323a can hold the semiconductor device D loaded onto the loading part 321a when an external force does not exist.

The compression spring 330 makes a repulsive elastic force applied between the insert body 310 and the insert pocket 320 when an external force does not exist.

In the following description, a use state of the insert 300 is explained in detail.

Figure 6:
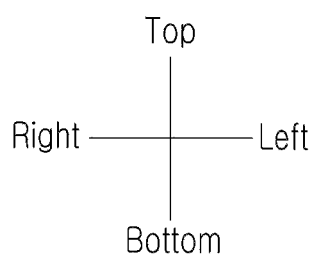
FIG. 6 to FIG. 8 show views that illustrate the operation state of the insert of FIG. 3.
Figure 6:
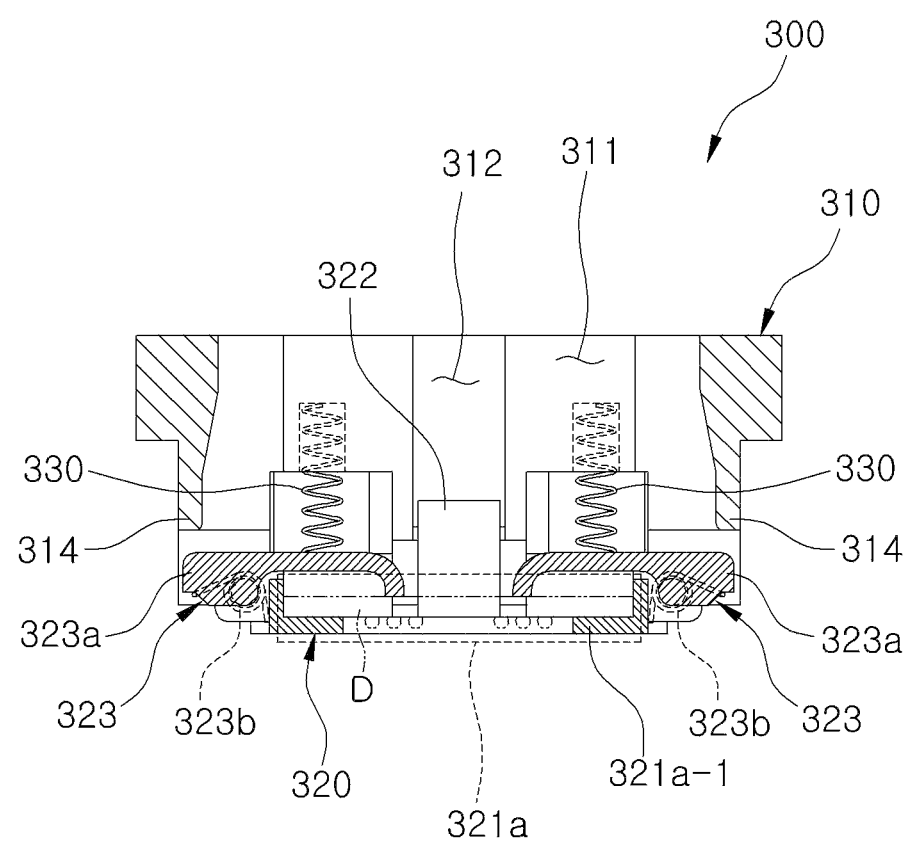
Figure 7:
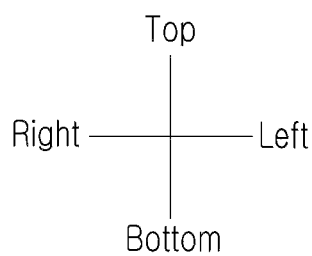
Figure 7:
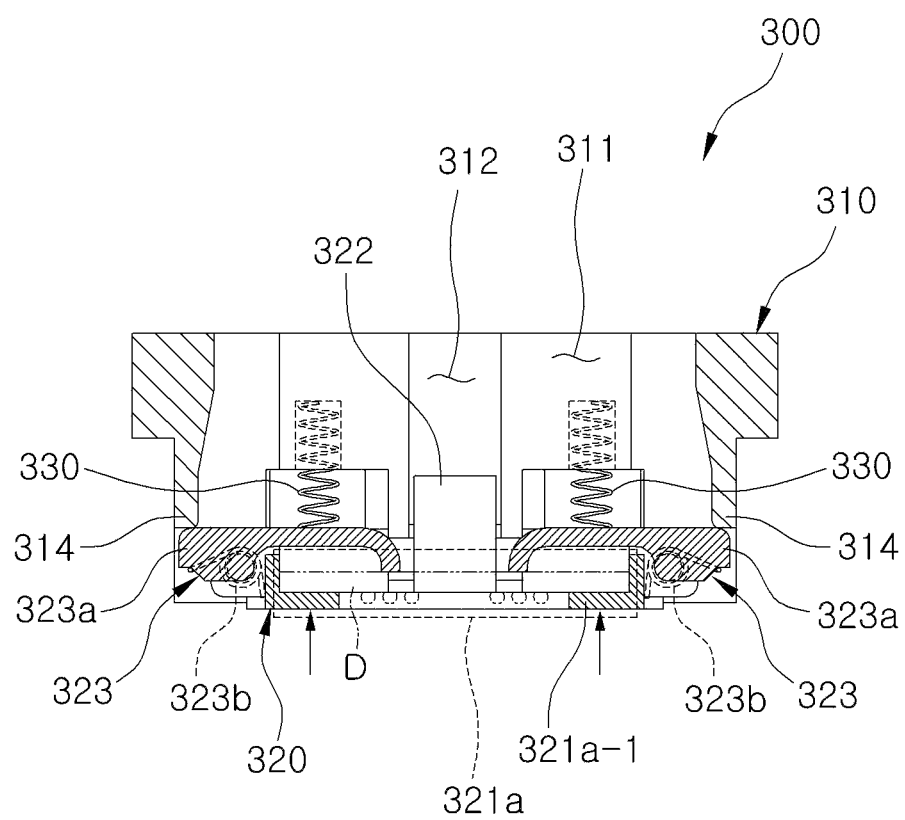

When an external force is applied to the insert pocket 320, in a state as shown in FIG. 6, from the bottom side to the top side, the insert pocket 320 is lifted up and thus the opposite ends of the latch bars 323a are locked to the latch locking protrusions 314, respectively, as shown in FIG. 7.

Figure 8:
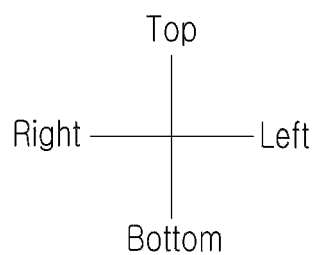
Figure 8:
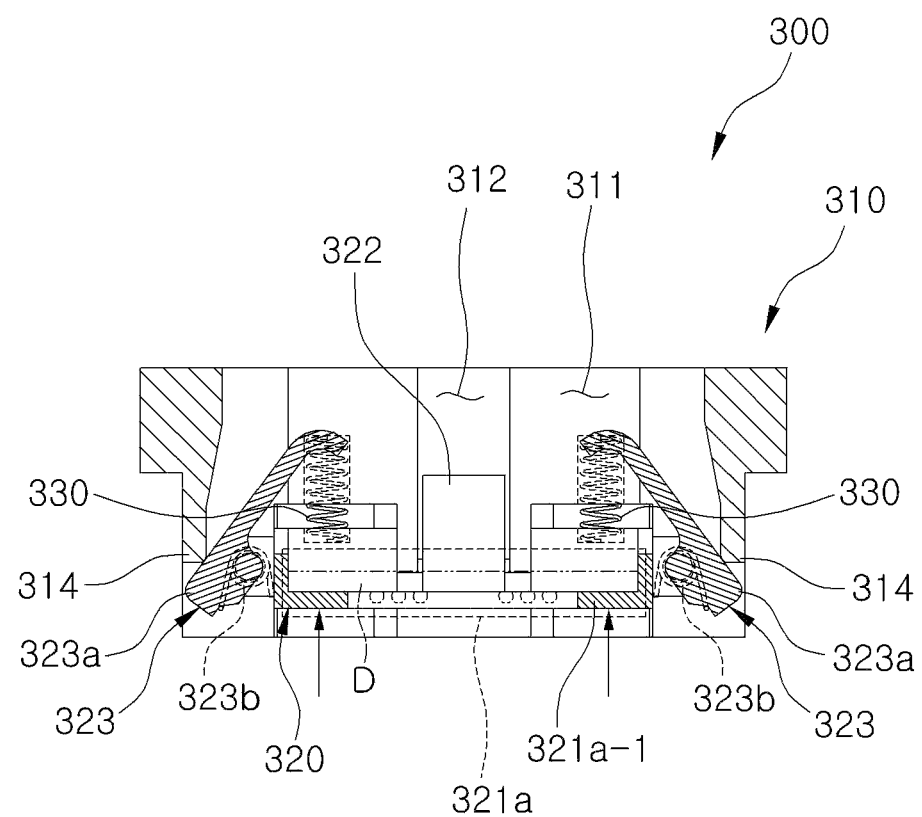

When the external force is continuously exerted on the insert pocket 320 in the state of FIG. 7, the insert pocket 320 is lifted up higher, so that the one end of each of the latch bars 323a is pivotally lifted up and rotated with respect to the opposite end whose extended portion is locked by the latch locking protrusion 314. Thus, as shown in FIG. 8, the loading part 321a is opened or the holding state of the semiconductor device D loaded onto the loading part 321a is released. That is, the semiconductor device D can be loaded onto or unloaded from the loading part 321a.

When the external force is removed, the insert pocket 320 is lowered to the bottom side by gravity and an elastic force of the compression spring 330. In addition, the latch bars 323a are reversely rotated by the elastic force of the holding spring 323b to close the loading part 321a or to hold a semiconductor device D loaded onto the loading part 321a, as shown in FIG. 6.

In the present embodiment, when the latch apparatus 323 is broken down, only the insert pocket 320 can be replaced, so that the insert 300 can easily be recovered.

<Embodiment 3>

Figure 9:
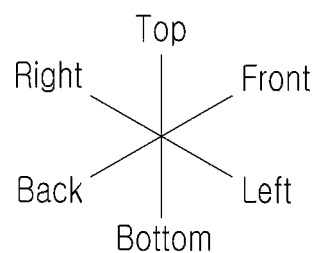
FIG. 9 is a perspective view illustrating an insert pocket applied to an insert in accordance with a third embodiment of the present invention.
Figure 9:
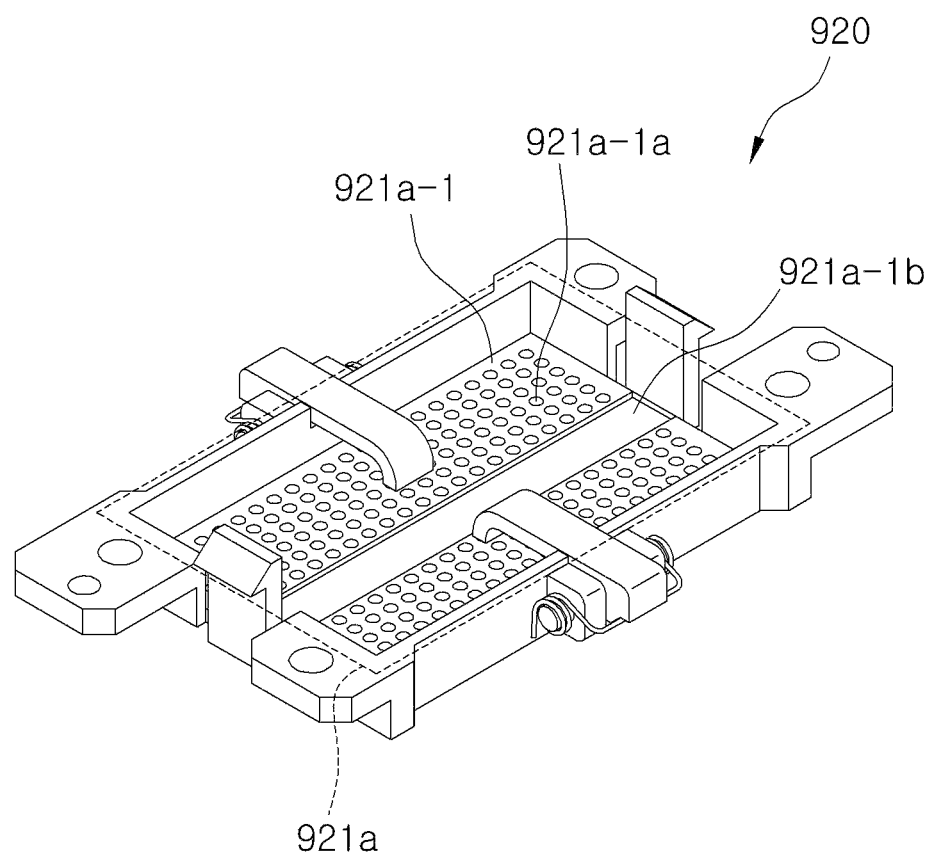

FIG. 9 is a perspective view illustrating an insert pocket 920 adapted to an insert in accordance with a third embodiment of the present invention.

Figure 10:
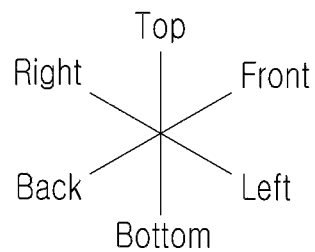
FIG. 10 is a perspective view illustrating an insert pocket modified from the insert pocket shown in FIG. 9.
Figure 10:
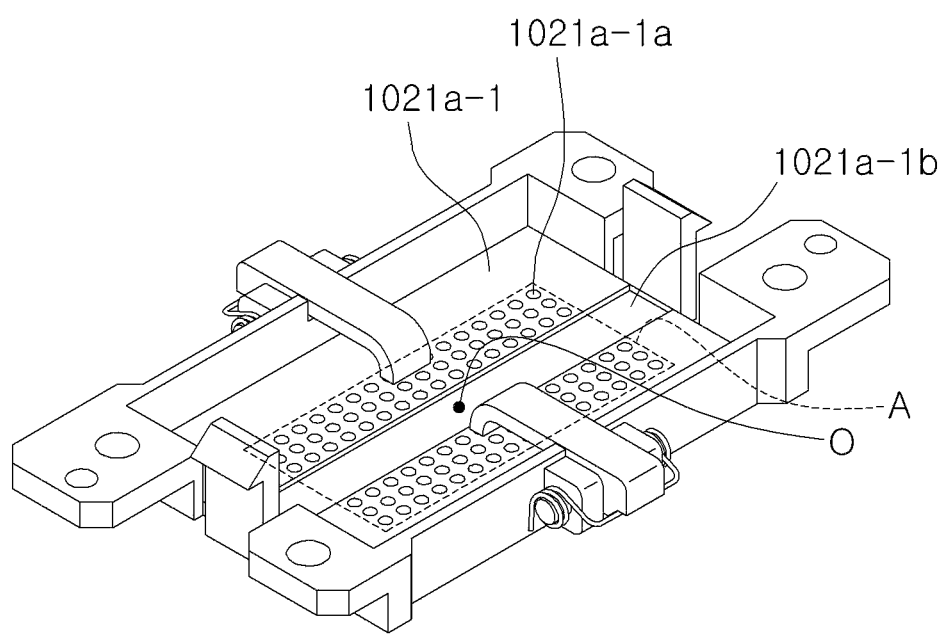

The insert pocket 920 is configured to have a bottom surface 921a-1 in a loading part 921a. The bottom surface 921a-1 forms a plurality of holes 921a-1a thereon, which holes are spaced apart from each other at a certain distance. The present embodiment is implemented in such a way that a plurality of holes 921a-1a are formed in the entire area of the bottom surface 921a-1. However, it should be understood that the embodiment can be modified in such a way that the plurality of holes 1021a-1a are formed within a certain area A from the center point O in a bottom surface 102 1a-1, as shown in FIG. 10, if the maximum size of semiconductor devices to be tested is acceptable.

The bottom surface 921a-1 has a position groove 921a-1b thereon, which corresponds to the protrusion portion formed on the lower surface of the semiconductor device. That is, the protrusion portion of the semiconductor device is fitted onto the position groove 921a-1b so as to hold the semiconductor device. The present embodiment is implemented in such a way that the position groove 921a-1b is formed as a liner zone from one end to the opposite end of the bottom surface 921a-1. However, it should be understood that the position groove can be formed in such a way to correspond to the shapes and positions of the protrusion portions of semiconductor devices.

In the following description, the operation of the holes 921a-1a and the position groove 921a-1b is explained with reference to FIG. 11 and FIG. 12.

Figure 11:
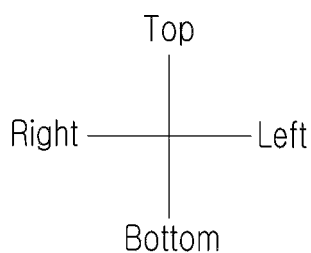
FIG. 11 and FIG. 12 are the use state views that illustrate the features of the insert pocket of FIG. 9.
Figure 11:
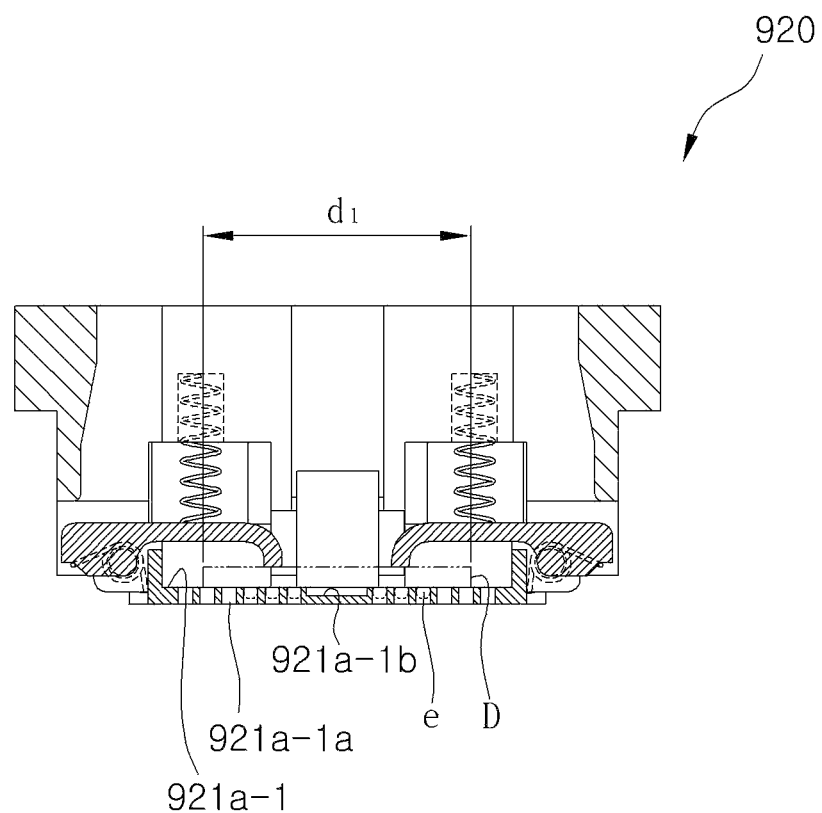

As shown in FIG. 11, when a semiconductor device D whose size is $d_1$ is located at the bottom surface 921a-1, the protrusion portion of the semiconductor device D is fitted onto the position groove 921a-1b and a plurality of leads e of the semiconductor device D are also inserted to the holes 921a-1a formed in the area on which the semiconductor device D is placed, thereby holding the position of the semiconductor device D. In the present embodiment, the leads e of the semiconductor device D are shaped as a ball in FIG. 1, however, they can also be linear.

Figure 12:
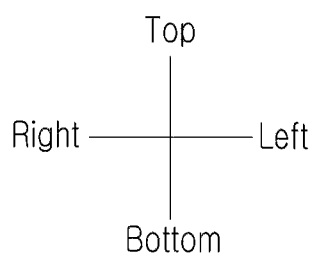
Figure 12:
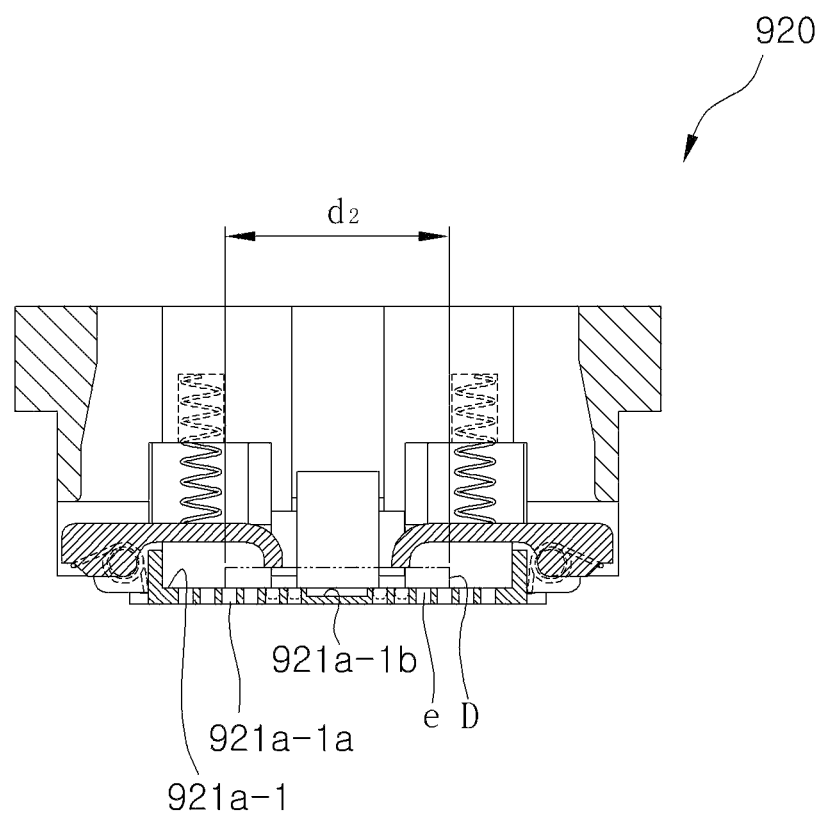

As shown in FIG. 12, although the semiconductor device D to be tested is replaced with small (or large) sized semiconductor devices, as for example in $d_2$, the plurality of leads e of the replaced semiconductor device D are inserted to the holes 921a-1a formed in the area on which the semiconductor device D is placed, thereby holding the position of the replaced semiconductor device D.

Therefore, when a position groove and a plurality of holes are formed in the bottom of the loading part of the insert so that the position groove and the plurality of holes can correspond to the standardized protrusion portion of and the standardized spacing between the leads of the semiconductor devices, respectively, the insert and the insert pocket do not need to be replaced, although the semiconductor devices are replaced with different sized semiconductor devices.

Although the plurality of holes 921a-1a are formed in the insert pocket 920 in the embodiment of the present invention, it should be understood that the present invention may be applied to Conventional art 1 in such a way that the plurality of holes can be formed, spaced apart from each other at a certain distance, in the bottom of the loading part of the conventional integral type insert, in which the conventional integral type insert means an insert in which the insert body and the insert pocket are formed as a single body.

Although the embodiments are individually described based on the features of the present invention, it should be understood that all of the features can also be applied to one insert and this may become another embodiment of the present invention.

In addition, the embodiments of the present invention are implemented in such a way to include the latch apparatus as a pair. However, it should be understood that they can be configured by one latch apparatus only if a semiconductor device can be held in and released from the loading part. Also, the present invention may be implemented by three or more latch apparatuses.

Furthermore, the embodiments of the present invention are implemented in such a way to include the hook as a pair. However, it should be understood that they can be configured by one hook only if the insert pocket can be detachably coupled to the insert body in such a way so as to move freely. Also, the present invention may be implemented by three or more hooks.

As described above, the present invention has the following effects:

First, although the hooks are damaged, only the insert pocket can be replaced. Therefore, the insert body can be reused and the wastage of resources can be also prevented.

Second, although the latch apparatus, which is relatively easily break down and is difficult to be replaced because disassembling and installing processes are difficult, is configured in the insert pocket, when the latch apparatus is broken, only the insert pocket can easily be replaced and, accordingly, the replacement operation can be efficiently performed.

Third, when the semiconductor devices to be tested are replaced with different sized semiconductor devices, the insert can be reused, thereby reducing the wastage of resources and saving money by eliminating replacement costs.

Although exemplary embodiments of the present invention have been described in detail hereinabove, it should be understood that many variations and modifications of the basic inventive concept herein described, which may appear to those skilled in the art, will still fall within the spirit and scope of the exemplary embodiments of the present invention as defined in the appended claims.

What is claimed is:

1. An insert for a carrier board of a test handler comprising:
an insert body having a through-hole that allows a semiconductor device to be loaded to pass therethrough; and
an insert pocket that is detachably coupled to the insert body and has a loading part onto which the semiconductor device passing through the through-hole is loaded,
wherein,
the insert pocket comprises at least one or more hooks at a side(s) of the loading part for detachably coupling to the insert body; and
the insert body comprises at least one or more latch apparatuses installed on the wall side(s) of the through-hole to hold or release the semiconductor device loaded onto the loading part and at least one or more hook receiving grooves on a side(s) of the through-hole, which can receive the at least one or more hooks, respectively, and at least one or more hook locking protrusions on which the at least one or more hooks can be hung, respectively.

2. The insert according to claim 1, wherein a position groove is formed on the bottom of the loading part, to hold a position of the loaded semiconductor device.

3. The insert according to claim 1, wherein the at least one or more latch apparatuses hold or release the semiconductor device as the insert pocket is lifted up or lowered.

4. The insert according to claim 1, wherein:
the insert body comprises at least one or more latch apparatuses installed on the side wall(s) of the through-hole to hold or release the semiconductor device loaded onto the loading part;
the at least one or mode latch apparatuses hold or release the semiconductor device by applying a pressure in the lower direction; and
the semiconductor device is loaded onto the loading part from the upper.

5. The insert according to claim 1, wherein a plurality of holes are formed at the bottom, through which holes leads of the semiconductor device are exposed in the lower direction.

6. An insert for a carrier board of a test handler, comprising:
a loading part on which a semiconductor device is loaded, wherein a position groove is formed at the bottom of the loading part to hold a position of the semiconductor device which has a protrusion portion on a lower surface loaded onto the loading part, and wherein at least one or more latch apparatuses is installed on the wall side(s) of a through-hole of the insert, which allows the semiconductor device to be loaded to pass therethrough, to hold or release the semiconductor device loaded onto the loading part.

7. The insert according to claim 6, wherein a plurality of holes are formed at the bottom, through which holes leads of the semiconductor device are exposed in the lower direction.

8. An insert for a carrier board of a test handler comprising:
an insert body having a through-hole through which a semiconductor device to be loaded passes; and
an insert pocket having a loading part onto which the semiconductor device passing through the through-hole is loaded, the insert pocket being detachably coupled to the insert body,
wherein the insert pocket comprises:
a loading frame having the loading part; and
at least one or more latch apparatuses installed on the wall side(s) of the loading frame to hold or release the semiconductor device loaded onto the loading part.

9. The insert according to claim 8, wherein the at least one or more latch apparatus comprises:
a latch bar whose one end is pivotally coupled to the side of the loading frame and whose opposite end rotates with respect to the one end operating as a rotation axis, for holding or releasing the semiconductor device loaded onto the loading part; and a holding spring for applying an elastic force to the latch bar so that the latch bar can maintain its holding state.

10. The insert according to claim 9, wherein:
the insert pocket is coupled to the insert body to freely move within a certain space in the vertical direction with respect to the loading part;
the opposite end of the latch bar protrudently extends from the rotation axis in the length direction of the latch bar; and
the insert body has a latch locking protrusion by which the extended portion of the opposite end of the latch bar is locked while the latch bar is rotated when the insert pocket is lifted up.

11. The insert according to claim 8, further comprising:
a compression spring for applying a repulsive elastic force between the insert body and the insert pocket.

12. The insert according to claim 8, wherein the loading part has a position groove on the bottom thereof, to hold the loaded semiconductor device.

13. The insert according to claim 8, wherein a plurality of holes are formed at the bottom, through which holes leads of the semiconductor device are exposed in the lower direction.

14. The insert according to claim 13, wherein the plurality of holes are formed spaced apart from each other at a certain distance, so that different sized semiconductor devices, whose leads are spaced apart from each other at the same as the distance between the plurality of holes, can be loaded.

* * * * *